(12) United States Patent
Shiraishi (10) Patent No.: US 6,727,025 B1
(45) Date of Patent: Apr. 27, 2004

(54) PHOTOMASK AND EXPOSURE METHOD (75) Inventor: Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/806,593

(22) PCT Filed: Jun. 29, 1999

(86) PCT No.: PCT/JP99/03484

§ 371 (c)(1),
(2), (4) Date: Jun. 25, 2001

(87) PCT Pub. No.: WO00/19271

PCT Pub. Date: Apr. 6, 2000

(30) Foreign Application Priority Data

Sep. 30, 1998 (JP) .............................................. 10-277274

(51) Int. Cl.$^7$ ................................................. G03F 9/00
(52) U.S. Cl. ................................ 430/5; 430/11; 430/22; 430/30; 430/311
(58) Field of Search ............................ 430/5, 30, 22, 430/11, 311

(56) References Cited

U.S. PATENT DOCUMENTS 5,480,747 A * 1/1996 Vasudev ........................ 430/5
6,021,009 A * 2/2000 Borodovsky et al. ........ 359/888
6,383,719 B1 * 5/2002 Bula et al. ................... 430/312

FOREIGN PATENT DOCUMENTS

| JP | A 3-41714 | 2/1991 |
|---|---|---|
| JP | A 3-155120 | 7/1991 |
| JP | A 7-319149 | 12/1995 |
| JP | A 8-95233 | 4/1996 |
| JP | A 8-321450 | 12/1996 |
| JP | A 9-90608 | 4/1997 |
| JP | A 10-282635 | 10/1998 |

* cited by examiner

Primary Examiner—Mark F. Huff
Assistant Examiner—Kripa Sagar (57) ABSTRACT

A photomask illuminated with an exposure illuminating light having a short wavelength of, e.g., about 200 nm or less and having an improved uniformity of transmittance distribution. On one surface (B) of a flat substrate (1) made of quartz, a quartz glass, or a quartz glass to which a predetermined impurity is added, a thin film (3) made of a material semitrasparent to the exposure illuminating light. The transmittance distribution for the illuminating light of the substrate (1) is measured prior to the formation of the thin film (3), and the distribution of the thickness of the thin film (3) is determined so as to compensate the unevenness of the transmittance distribution. An original pattern (2) is formed on the opposed surface (A) of the substrate (1) to the surface (B).

19 Claims, 4 Drawing Sheets

PHOTOMASK AND EXPOSURE METHOD

This application is the national phase under 35 U.S.C. §371 of prior PCT International Application No. PCT/JP99/03484 which has an International filing date of Jun. 29, 1999 which designated the United States of America, the entire contents of which are hereby incorporated by reference.

TECHNICAL FIELD

The present invention relates to a photomask used in a lithography process for producing fine patterns of electronic devices such as semiconductor integrated circuits, image pickup devices (CCDs etc.), liquid crystal displays and thin film magnetic heads, and the present invention also relates to an exposure method using this photomask. The present invention is preferably used when light having a wavelength of about 200 nm or less is used as illumination light for exposure.

BACKGROUND ART

Conventionally, in a lithography process for forming a fine pattern of an electronic device such as a semiconductor integrated circuit and a liquid crystal display, there is used a method in which a reticle as a photomask on which an original pattern obtained by enlarging a pattern to be formed four to five times is disposed on a projection exposure apparatus, and under predetermined illumination light for exposure (exposure light), the original pattern is reduced in size and projected and transferred onto a wafer (or glass plate or the like) as a substrate to be exposed on which a photoresist is applied.

When such a pattern of the reticle is transferred, a line width of the resist pattern formed on the wafer after development is increased or reduced in accordance with integrated exposure amount of the exposure light with respect to the wafer. Thereupon, in order to obtain a designed line width over the entire surface of the resist pattern, the illumination distribution of the exposure light to the pattern of the reticle is maintained uniform extremely precisely so that an error of the distribution is in a range of, for example, ±1% within the illumination region.

In the projection exposure apparatus, in order to enhance resolution to meet finer semiconductor integrated circuits, wavelength (exposure wavelength) of the exposure light tends to be shorter. At the present, 248 nm of a KrF excimer laser becomes mainstream as the exposure light wavelength, but 193 nm of an ArF excimer laser having shorter wavelength will soon be in practical use. Further, research has been conducted to develop a projection exposure apparatus using an $F_2$ laser having shorter wavelength (wavelength is 157 nm).

If the exposure light wavelength is in vacuum ultraviolet region (VUV region) of wavelength of about 200 nm or less, e.g., 157 nm by the $F_2$ laser, kinds of preferable materials as substrate material of the reticle which allow exposure light of such short wavelength to pass therethrough are limited. For example, fluorite (calcium fluoride) has excellent transmissivity at that wavelength, but since the linear expansion coefficient is as great as about $20 \times 10^{-6}$/K, the fluorite is not always preferable as the substrate material of reticle. With such a great linear expansion coefficient, the substrate of the reticle is expanded by the illumination heat of the exposure light generated when the exposure and transfer, and the positional precision of a pattern to be transferred is deteriorated. Therefore, in order to use the fluorite, it is necessary to enhance the cooling function of the reticle for example.

As explained above, in the projection exposure apparatus, the exposure light wavelength tends to be shorter, but if the exposure light wavelength becomes about 157 nm, there is conventionally almost no material for the substrate of the reticle having high transmissivity and relatively small linear expansion coefficient.

In this regard, an attempt to use quartz and a synthetic quartz (quartz glass) doped with fluorine as the substrate material which is substantially transparent with respect to light of wavelength of about 157 nm has been made.

However, also with respect to the quartz and the quartz glass doped with fluorine, the wavelength of about 157 nm is close to the absorbing end (wavelength from which material-inherent abrupt absorption starts) of light for each material, and there is an adverse possibility that the transmissivity distribution of the material is largely varied at the wavelength near 157 nm due to slight non-uniformity in composition of the material, stress deformation generated in the material or the like. Due to these factors, if the transmissivity distribution inside the reticle substrate becomes uneven (non-uniformity), the uniformity in line width of the resist pattern to be transferred onto the wafer is deteriorated as in the case in which the illumination distribution of the exposure light for illuminating the reticle becomes non-uniform. The deterioration in uniformity in line width of the resist pattern brings about non-uniformity in circuit line width in an electronic device to be produced, which largely deteriorates operating speed of the electronic device for example.

In view of the above circumstances, it is a first object of the present invention to provide a substrate for a photomask having highly uniform transmissivity distribution and to provide the photomask.

It is a second object of the invention to provide a substrate for a photomask having a. relatively high transmissivity with respect to light of short wavelength of about 200 nm or less, for example, and having a uniform transmissivity distribution, and to provide the photomask.

It is a third object of the invention to provide an exposure method and a producing method of a device capable of producing an advanced device using the photomask.

Disclosure of the Invention

A substrate for a photomask according to the present invention is a substrate for a photomask on which an original pattern is formed, and the substrate is provided with a transmisslvity compensating member which compensates for non-uniformity of a transmissivity distribution inside the substrate.

According to the present invention, if the photomask is irradiated with exposure illumination light (exposure light) of a predetermined wavelength, a reduction amount of the transmissivity by the transmissivity compensating member is reduced in a portion of the substrate where the transmissivity of the substrate itself is lower than the average value under that wavelength, and the reduction amount of the transmissivity by the transmissivity compensating member is increased in a portion of the substrate where the transmissivity of the substrate itself is higher than the average value. With this arrangement, the non-uniformity of the transmissivity distribution of the substrate is compensated, and it is possible to secure sufficiently high uniformity of the transmissivity distribution to be used as a substrate for the photomask.

In this case, it is preferable to. form the substrate of quartz, quartz glass (e.g., synthetic quartz glass having hydroxyl (OH group) of concentration of 1000 ppm or more), quartz glass doped with a predetermined impurity (e.g., fluorine ($F_2$) or the like), sapphire ($Al_2O_3$) or magnesium fluoride ($MgF_2$). These materials have relatively high transmissivity even in vacuum ultraviolet region of wavelength of about 200 nm or less, and since the quartz to the sapphire have linear expansion coefficient smaller than that of fluorite, the quartz to the sapphire are suitable as the substrate of the photomask which is irradiated with exposure light of such short wavelength. The magnesium fluoride can allow light of shorter wavelength to pass through as compared with the fluorite.

One example of the transmissivity compensating member is a thin film provided on one surface of the substrate, and a film thickness distribution of this thin film is set in accordance with the transmissivity distribution of the substrate. In this case, the transmissivity distribution of the substrate can be compensated only by controlling the film thickness distribution.

The transmissivity compensating member may be formed by reforming, in at least one surface of the substrate, a vicinity of the one surface of the substrate, or the transmissivity distribution may be formed by providing another substrate other than the substrate with a transmissivity distribution which substantially compensates for the non-uniformity of the transmissivity distribution of the substrate.

Next, a first photomask according to the present invention is a photomask which includes a substrate having a thin film as the transmissivity compensating member, and an original pattern is formed on a surface of the substrate opposed to a surface on which the thin film is formed. With this arrangement, the original pattern can be formed without being affected by the transmissivity compensating member.

A second photomask according to the present invention is a photomask which has a substrate provided with the transmissivity compensating member according to the invention, and the original pattern is formed on one surface of the substrate. As this photomask, a mask having a substrate doped with a predetermined impurity with such a distribution as to compensate for transmissivity distribution of the substrate itself is included.

It is preferable that a line width of at least one portion of the original pattern is different from the designed value in accordance with the transmissivity distribution of the substrate provided with the transmissivity compensating member.

In the present invention, the designed value is a value obtained by multiplying a size of a pattern to be formed on a photosensitive object by a reciprocal of projection magnification of a projection optical system when the original pattern of the photomask is transferred onto the photosensitive object through the projection optical system. When the original pattern (including both dense pattern and isolated pattern) is transferred onto the photosensitive substrate, if the line width of the pattern to be actually formed on the photosensitive substrate becomes thin or short with respect to a size value of a pattern to be formed on the photosensitive substrate, the size value of the original pattern is increased or reduced to correct to compensate the variation amount in some cases, and a value after the correction is also included in the designed value of the invention.

Next, in a third photomask according to the present invention, an original pattern is formed on the substrate and in order to compensate for the non-uniformity of the transmissivity distribution inside the substrate, a line width of each pattern in the original pattern is changed in accordance with the transmissivity distribution of the substrate. With this photomask, in a portion thereof where the transmissivity of the substrate itself is lower than the average value for example, the line width of a light-shield pattern in the original pattern is made thinner than the designed value, and in a portion where the transmissivity of the substrate itself is higher than the average value, the line width of the light-shield pattern is made thicker than the designed value. With this arrangement, the transmissivity distribution of the photomask is uniformized.

Next, in a first exposure method according to the present invention which illuminates a photomask to expose a photosensitive object with light passing through an original pattern of the photomask, the substrate is provided with a transmissivity compensating member in order to compensate for non-uniformity of a transmissivity distribution inside a substrate of the photomask. That is, the first or second photomask of the present invention is used.

In a second exposure method according to the present invention which illuminates a photomask to expose a photosensitive object with light passing through an original pattern of the photomask, in order to compensate for non-uniformity of a transmissivity distribution of the photomask, an illumination distribution of light on the photosensitive object is adjusted in accordance with the transmissivity distribution.

With the second exposure method of the present invention, the illumination distribution of the light on the photosensitive object is adjusted in accordance with the transmissivity distribution of the photomask, and the uniformity of the illumination distribution of the light on the photosensitive object is enhanced, thereby improving the uniformity of the line width of the pattern formed on the photosensitive material.

In a third exposure method according to the present invention which illuminates a photomask to expose a photosensitive object with light passing through an original pattern of the photomask, in order to compensate nonuniformity of a transmissivity distribution inside a substrate of the photomask, a line width of each pattern in the original pattern is changed in accordance with the transmissivity distribution of the substrate. With this arrangement, the third photomask of the invention is used.

Next, a first device producing method in accordance with the present invention comprises transferring a device pattern onto a substrate for a device using the exposure method of the present invention. A second, third or fourth device producing method according to the present invention is a device producing method for producing a predetermined device using the first, second or third photomask of the present invention, and comprises exposing an original pattern on the substrate onto a device substrate by illuminating the photomask with illumination light passing through the substrate. The uniformity of the transmissivity distribution of the photomask according to the present invention is extremely high and therefore, the uniformity of the line width of the circuit pattern of the device formed on the substrate is enhanced, and an advanced device can be produced.

BEST MODE FOR CARRYING OUT THE INVENTION

Preferred embodiments of the present invention will be explained. First, a first embodiment will be explained with reference to FIGS. 1 to 3.

Figure 1A:
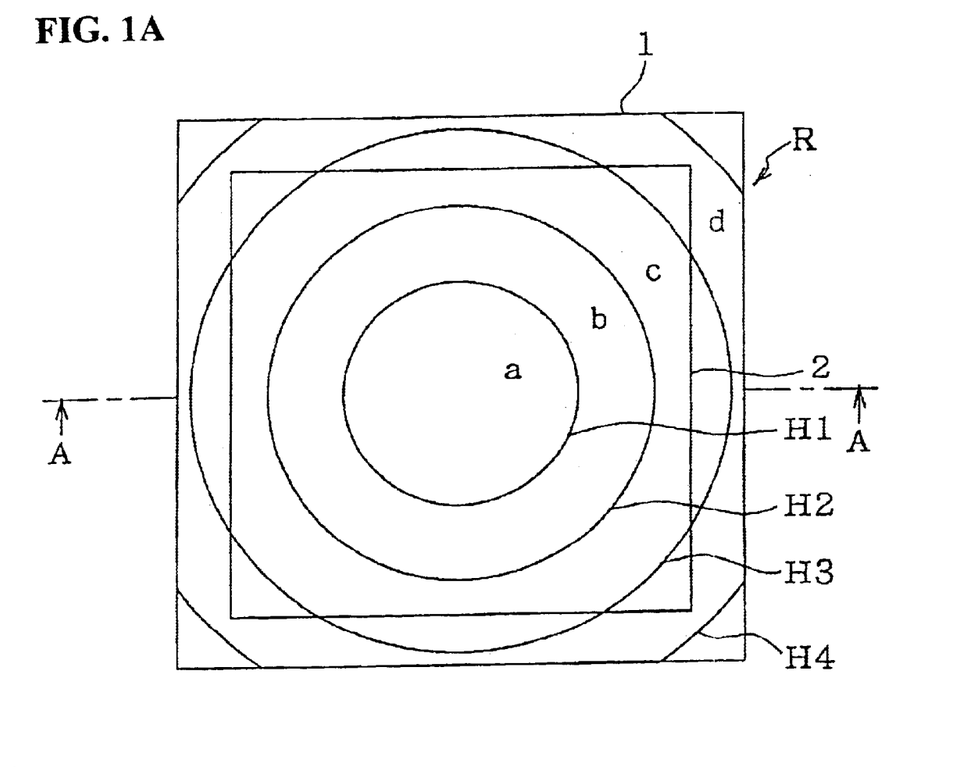
FIG. 1A is a plan view showing a reticle according to a first embodiment of the present invention.
Figure 1B:
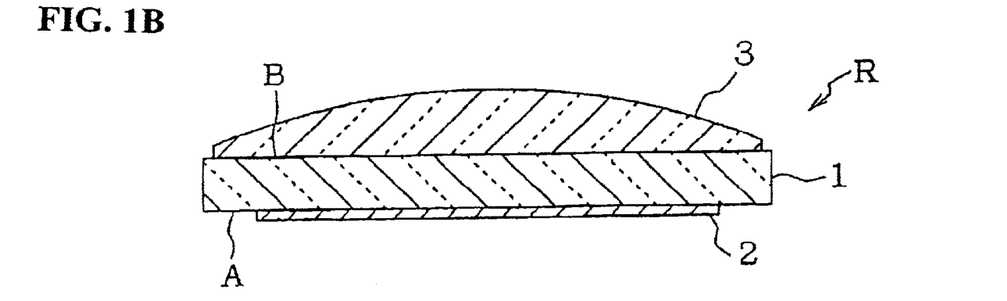
FIG. 1B is a sectional view taken along a line AA in FIG. 1A.

FIG. 1A is a plan view showing a reticle R as a photomask of this embodiment, and FIG. 1B is a sectional view taken along a line A—A in FIG. 1A. As shown in FIGS. 1A and 1B, an original pattern 2 is formed on a one surface (pattern surface) A of a substantially square flat substrate 1 which is transparent with respect to light having wavelength (exposure wavelength) of exposure illumination light for illuminating the reticle R. A thin film 3 having film thickness distribution suitable for transmissivity distribution of the substrate 1 is formed on a surface (back surface) B opposed to the surface A in order to compensate non-uniformity of the transmissivity distribution of the substrate 1. This thin film 3 corresponds to a transmissivity compensating member of this invention. Contour lines HI to H4 are curves connecting points of the thin film 3 having the same thickness, and in the reticle R of this embodiment, the thickness of the thin film 3 is increasing toward the center of the reticle R. That is, in the thin film 3, a portion (central portion) "a" thereof surrounded by the contour line H1 is most thick, and portions "b", "c" and "d" become thinner in this order.

The thin film 3 is made of semitransparent material having transmissivity in some degree with respect to exposure wavelength when this reticle R is used, and the transmissivity can be controlled in accordance with the film thickness. In the case of FIGS. 1A and 1B, the transmissivity with respect to the exposure wavelength of the substrate 1 itself is higher at its center, and becomes lower toward the periphery or outer side of the substrate 1. Therefore, in order to compensate this non-uniformity to realize uniform transmissivity over the entire surface of the reticle R, the film thickness distribution as shown with the contour lines H1 to H4 is set.

Here, if it is assumed that the exposure wavelength is 157 nm, examples of materials of the substrate 1 are quartz, synthetic quartz (quartz glass) added (doped) with a predetermined impurity such as fluorine ($F_2$), and quartz glass having hydroxyl (OH group) of concentration of 1000 ppm or more. As the material of the substrate 1 of the reticle R, a material which is not transparent with respect to the exposure wavelength, e.g., a common synthetic quartz when the exposure wavelength is 157 nm can be made thinner (about 2 mm or less) than a normal case (about 6 mm) for use.

As the quartz as the material of the substrate 1, i.e., as the quartz which is crystallized into a predetermined state, a synthetic quartz produced (incubated) by a hydro-thermal method for example can be used. Since the synthetic quartz has excellent transmissivity with respect to ultraviolet rays of wavelength up to 146 nm, the synthetic quartz has sufficient transmissivity with respect to the exposure light of 157 nm of the $F_2$ laser. When the quartz is used as the material of the substrate 1, it is preferable that the pattern surface A onto which the original pattern 2 shown in FIG. 1B is formed is set parallel to an optical axis (Z axis or c axis) of the quartz. This is because that since the linear expansion coefficient of the quartz is about $1.337 \times 10^{-5}$/K in a direction (X axis or a axis, Y axis or b axis) perpendicular to the optical axis and about $0.797 \times 10^{-5}$/K in the direction of the optical axis, it is advantageous to set the direction having greater linear expansion coefficient into a thin direction, and the direction having smaller linear expansion coefficient. i.e., the optical direction into a direction along the large pattern surface. With this arrangement, when the reticle pattern is formed and when wafer is exposed. adverse effect due to the thermal expansion of the substrate 1 is reduced, and it is possible to enhance the formation precision of the reticle pattern and to enhance the formation precision of the circuit pattern on the wafer.

The linear expansion coefficient of the quartz is about ½ to ⅓ or less as compared with the fluorite, the thermal expansion amount of the quartz is smaller than that of the fluorite.

Even if the quartz is a synthetic quartz, it is possible to obtain substantially the same as or more excellent transmissivity than that of a natural quartz. For example, the content of hydroxyl of the natural quartz is 4 ppm and wavelength capable of passing through the quartz is 152 nm, values of the synthetic quartz are varied, and the best synthetic quartz has the content of hydroxyl is likewise 4 ppm and the wavelength capable of passing through the quartz is about 146 nm. Therefore, even the exposure light is the $F_2$ laser light (wavelength is 157), the synthetic quartz has excellent transmissivity.

Next, as a producing method of a synthetic quartz ("fluorine-doped quartz glass", hereinafter) doped with fluorine ($F_2$) used as the substrate 1, a method disclosed in Japanese Patent Application Laid-open No.H8-67530 can be used. According to this method, a silicon compound such as $SiCl_4$ is hydrolyzed in hydrogen flame by a VAD (Vapor Phase Axial Deposition) method to obtain glass fine particles. Next, the glass fine particles are deposited to form a porous glass. A formation method and a condition of the porous glass are not limited, and a so-called OVD (Outside Vapor Deposition) or so-called sol-gel method or the like.in addition to the VAD method may be employed.

Then, the porous glass is heated in atmosphere including fluorine comprising $SiF_4$/He for example to obtain porous glass doped with fluorine.

The fluorine-doped synthetic quartz glass is heated in atmosphere including hydrogen glass to obtain a synthetic quartz glass doped with the fluorine and hydroxyl (OH group).

In this embodiment, OH group is doped in addition to fluorine in this manner, and this enhances the transmissivity of the substrate. The concentration of fluorine is preferably about 1 to 5% by weight, and the concentration of OH group is preferably about 100 ppm to 1000 ppm.

In addition to fluorine, about $1 \times 10^{17}$ molecules/cm$^3$ to $1 \times 10^{10}$ molecules/cm$^3$ may be doped. By doping hydrogen also, it is possible to remarkably enhance the ultraviolet resistance by synergism of characteristics with respect to the ultraviolet resistances of fluorine and hydrogen molecules.

A common substrate at present has a thickness of about 6 mm and a size of about 150×150 mm, and the producing method such as the VAD method, the OVD method and the sol-gel method are suitable of a columnar quartz glass, and are not suitable for producing a flat glass having such a large area. Thereupon, when the quartz glass substrate is produced, it is possible to employ such a method that a columnar glass rod is produced by any of the above methods and then, the columnar glass rod is deformed into a substantially flat plate-like shape by heating press and then, the flat glass is formed into a desired size by grinding and polishing. At the time of press deformation, the glass maybe subjected to hydrogen atmosphere treatment at 500° C. after the heating processing. With this method, it is possible to produce a substrate of a large reticle of 230 mm (9 inches)× 230 mm.

With the above method, a reticle substrate of 150×150 mm or 230×230 mm can be formed from a columnar quart glass having small diameter, and it is possible to produce a reticle of this embodiment by a smaller, i.e., more inexpensive production facilities. Further, since the linear expansion coefficient of quartz glass is as small as about $0.5 \times 10^{-6}$/K, the thermal expansion amount at the time of working and exposure, and if a reticle using the quartz glass as substrate is used, precision of line width and the like of the circuit pattern to be formed on a wafer is largely enhanced.

Further, a producing method of the substrate 1 using the synthetic quartz glass whose OH group concentration is 1000 ppm or more will be explained. A synthetic quartz glass used for producing the substrate 1 in this case is a synthetic quartz glass whose structure determination temperature is 1200 K or less and whose OH group concentration is 1000 ppm or more, more preferably, 1000 to 1300 ppm.

By setting the OH group concentration to 1000 ppm or more and structure determination temperature to 1200 K or less, when the glass is applied to vacuum ultraviolet rays having wavelength of about 200 nm or less, scattering loss and absorbing loss can be reduced to extremely low level, and deterioration with time can be reduced. Therefore, by producing the substrate 1 using such a synthetic quartz glass, it is possible to obtain a reticle R having high transmissivity and excellent ultraviolet resistance.

Next, examples of materials of the thin film 3 as the transmissivity compensating member are oxide such as silicon dioxide ($SiO_2$) and aluminum oxide ($Al_2O_3$), and fluoride such as magnesium fluoride ($MgF_2$) and aluminum fluoride ($AlF_3$). In order to obtain necessary absorptivity, an absorbent impurity such as metal like chromium (Cr) may be added. In this case, oxide such as silicon dioxide and aluminum oxide is stable with respect to acid such as sulfuric acid which is cleaning liquid used for cleaning reticles using the oxide, the oxide is excellent as a material of the thin film 3. On the other hand, if fluoride is used as the material of the thin film 3, there is merit that the present invention can be applied also to shorter exposure wavelength by the characteristics of transmissivity.

A metal thin film such as chromium and aluminum may be used as the material of the thin film 3. In this case, since illumination light is reduced mainly by reflection, an absorbance amount of the thin film 3 itself is only a slight amount, and there is merit that durability at the time of irradiation is excellent.

In FIG. 1B although the thickness of the thin film 3 is illustrated very thick with respect to a thickness (usually about 6 mm) of the substrate 1 of the reticle so as to emphasize variation over the entire surface of the thin film 3, the actual thickness of the thin film 3 is as small as about some 100 μm or less.

In the above embodiment, it is assumed that the wavelength is 157 nm, but it is apparent that the present invention can also be applied when exposure light having long wavelength such as the ArF excimer laser (wavelength is 193 nm) or exposure light such as the $Ar_2$ laser light (wavelength 126 nm) shorter than 157 nm or the $Kr_2$ laser light (wavelength is 147) are used. When exposure light of wavelength shorter than 157 nm, fluorite (CaF2), magnesium fluoride ($MgF_2$) or the like can be used as a material of the substrate 1. When the fluorite is used as the substrate of the reticle, since the fluorite has great linear expansion coefficient, it is preferable to maintain a temperature of the reticle as constant as possible by a method for circulating gas (nitrogen, helium or the like) whose temperature is adjusted to a predetermined level.

Sapphire ($Al_2O_3$) can be a material which can be used even if the wavelength is about 200 nm or less. Since the linear expansion coefficient of the sapphire at a room temperature is about $8 \times 10^{-6}$/K which is smaller than that of the fluorite, the effect of thermal expansion is small.

The material of the substrate 1 is not limited to the above-described substances, and the material may be selected in accordance with the transmissivity with respect to the exposure wavelength. The material of the substrate 1 may be the same and doped impurity or producing method of the substrate 1 may be different. That is, in the present invention, the material of the substrate 1, the presence or absence of additive, kind of additive and a producing method of the substrate 1 are not limited, and any material, additive and producing method may be used only if the optical characteristics (including transmissivity, linear expansion coefficient and the like) required as a photomask (reticle) is satisfied.

Next, one example of the producing method of the reticle of the embodiment will be explained using FIGS. 2 and 3.

Figure 2:
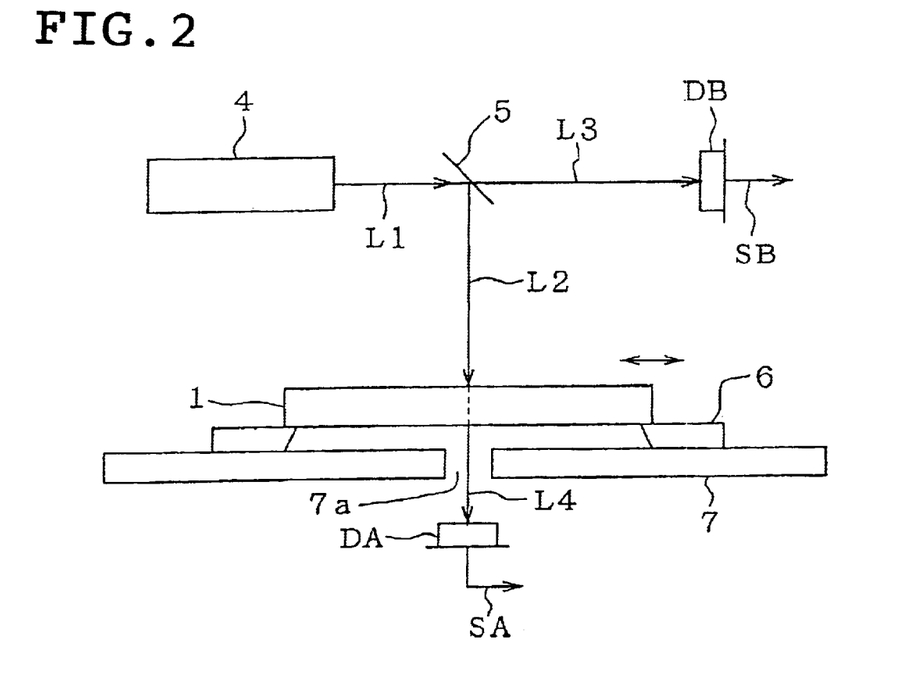
FIG. 2 is a schematic block diagram showing an essential portion of a measuring system for measuring a transmissivity distribution of the substrate 1 of the reticle shown in FIGS. 1A and 1B.

FIG. 2 is a schematic block diagram showing an essential portion of a measuring system for measuring a transmissivity distribution of the substrate 1 itself of the reticle R shown in FIGS. 1A and 1B. In FIG. 2, a light pencil L1 emitted from a light source 4 having substantially the same wavelength as the exposure wavelength branches by a half mirror 5, the substrate 1 is irradiated with branched one light pencil L2, and the other light pencil L3 enters an optoelectronic detector DB. A light pencil Light source 4 which has passed through the substrate 1 enters an optoelectronic detector DA. A photodiode, photo-multiplier and the like can be used as the optoelectronic detectors DA and DB. Outputs (optoelectronic conversion signals) SA and SB are supplied to a signal processing system where a ratio TAB (=SA/SB) of the outputs SA and SB is calculated. This ratio TAB corresponds to the transmissivty of the substrate 1 in this portion.

The substrate 1 is adsorbed and held by a holder (not shown). This holder is fixed to a movable stage 6, and is movable disposed on a base 7 in two-dimensional directions parallel to the pattern surface of the substrate 1. Although it is not illustrated, an encoder for measuring a position of the movable stage 6 and a sensor for detecting a position of the substrate 1 are also disposed. In this signal processing system, the movable stage 6 is driven by a motor (not shown), the substrate 1 is raster-scanned two-dimensionally along the pattern surface and at the same time, whenever the position of the substrate 1 is varied by a predetermined amount, the ratio TAB of the outputs SA and SB of the two optoelectronic detectors DA and DB is detected. By obtaining the ratio TAB as function of the two-dimensional position of the substrate 1, the transmissivity distribution of the substrate 1 and non-uniformity (variation) of the transmissivity distribution are measured.

Figure 3:
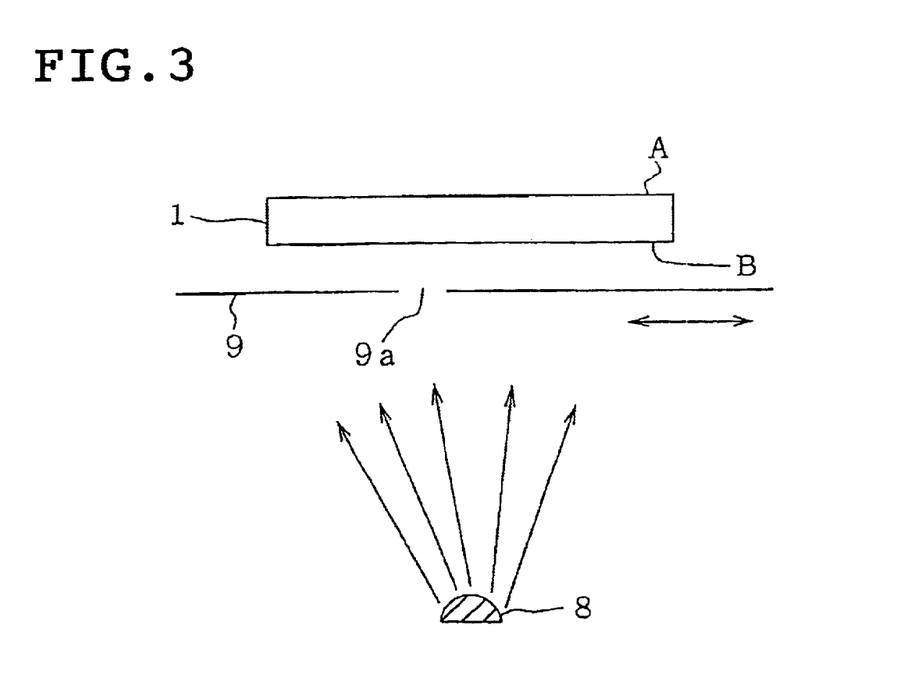
FIG. 3 is a view showing an essential portion of a film forming apparatus for forming a thin film on a surface B of the substrate.

In order to compensate the non-uniformity of the transmissivity distribution of the substrate 1 measured in this manner, the thin film 3 shown in FIGS. 1A and 1B are formed on the surface (back surface) B of the substrate 1 using a film-forming apparatus shown in FIG. 3. A evaporation substance (material of the thin film 3) discharged from a evaporation source 8 by heading or radiation of electron beam reaches a shield plate 9 disposed in the vicinity of the substrate 1. Only the evaporation substance which has passed through an opening 9a reaches the substrate 1, and a film is formed. At the time of this evaporation, the shield plate 9 is allowed to raster-scan two-dimensionally within a plane along the surface B of the substrate 1. Therefore, by changing the speed of the raster scan in accordance with location within the surface B of the substrate 1 where the opening 9a is located, it is possible to adjust a residence time of the opening 9a at each of positions in the surface B of the substrate 1. In this embodiment, by adjusting the residence time of the opening 9a, it is possible to adjust a. film thickness distribution of the thin film 3 evaporated in the surface B of the substrate 1 to a desired distribution. In this embodiment, the film thickness distribution of the thin film 3 is set to such a distribution as to compensate the non-uniformity of the transmissivity distribution of the substrate 1 itself measured as described above.

The forming method of the thin film 3 is not limited to the above-described evaportaion method only, and a CVD (Chemical Vapor Deposition) method or a sputtering method can also be used. The formation of the film thickness distribution is not limited to the method for controlling the growth itself of the film using the shield plate 9 at the time of film formation, and it is possible to use a method in which the film is previously formed with uniform thickness, the thin film is partially polished or ground, thereby varying the thickness distribution.

In the substrate 1 shown in FIG. 3 produced by the above-described method, a light-shield film for forming the original pattern is formed on the pattern surface A opposed to the surface B on which the thin film was formed. This light-shield film is subjected to pattern cleaning using an electron beam drawing apparatus or the like, thereby forming the original pattern 2 shown in FIGS. 1A and 1B. With this arrangement, the reticle R shown in FIGS 1A and 1B is complete. The light-shield film as the original pattern 2 is a thin film having absorbing or reflecting ability, and its transmissivity need not always be 0, and the light-shield film may be a so-called half-tone reticle using a film having transmissivity of about 10% or less of course.

By mounting the reticle R completed in this manner to a projection exposure apparatus, it is possible to expose a pattern of a predetermined layer of an electronic device.

Figure 5:
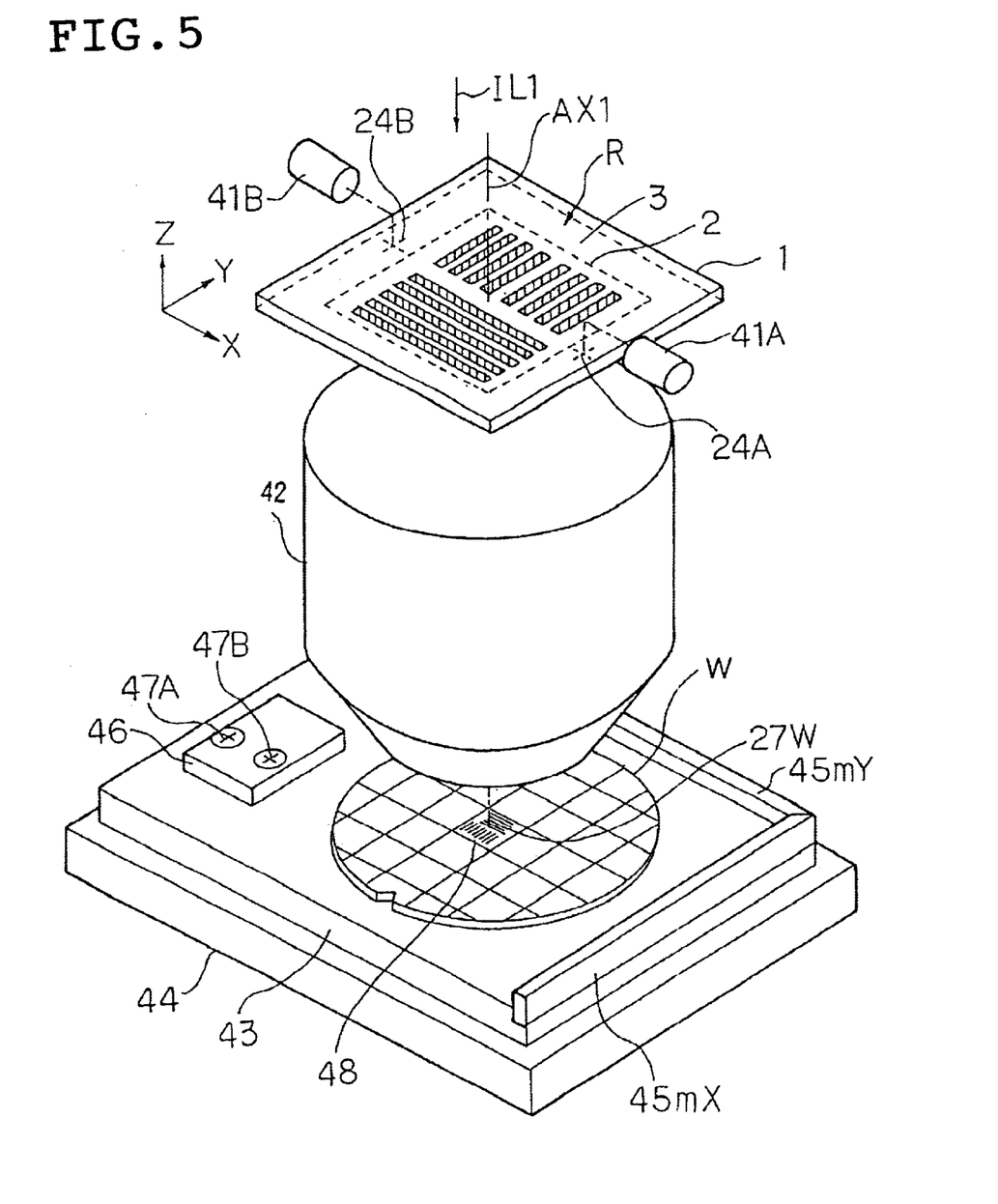
FIG. 5 is a perspective view showing an essential portion of a projection exposure apparatus in which the reticle R in FIGS. 1A and 1B is used to perfonn exposure.

FIG. 5 shows an essential portion of the projection exposure apparatus to which the reticle R is mounted. In FIG. 5, a wafer W is disposed on a lower surface of the reticle R held on a reticle stage (not shown) through a projection optical system 42 of reduced magnification β (β is ⅕, ¼ or the like). A photoresist is applied to a surface of the wafer W, and the surface is held such that it coincides with an image plane of the projection optical system 42.

In order to enhance the resolution in this embodiment, an $F_2$ laser (wavelength is 157 nm) is used as exposure light IL1, and kinds of glasses which can be used as a refractor are limited with respect to the exposure light of such short wavelength. Therefore, acatadioptric system or a reflection system may be used as the projection optical system 42 instead of the catadioptric system. In the following explanation, a Z axis is parallel to an optical axis AX1 of the projection optical system 42, and plane rectangular coordinates perpendicular to the Z axis are X axis and Y axis. First, the wafer W is held on a sample stage 43 through a wafer holder (not shown), and the sample stage 43 is fixed on an XY stage 44. The XY stage 44 is driven based on coordinates measured by moving mirrors 45mX and 45mY as well as corresponding laser interferometers, thereby positioning the wafer W in X and Y directions.

A reference mark member 46 on which. reference marks 47A and 47B are formed is fixed on the sample stage 43, alignment sensors 41A and 41B are disposed above alignment marks 24A and 24B formed such as to sandwich the original pattern 2 of the reticle R in the X direction. When the original pattern 2 is formed, the alignment marks 24A and 24B are formed at the same time. In this case, the reticle R is aligned with the sample stage 43 using the reference marks 47A and 47B, the alignment marks 24A and 24B and the alignment sensors 41A and 41B.

Thereafter, if superposition exposure is carried out, alignment of each shot region 48 on the wafer W is carried out using a wafer alignment sensor (not shown). Then, the shot regions 48 to be exposed on the wafer W are sequentially positioned at the exposure position and then, by irradiating the original pattern 2 of the reticle R with the exposure light IL1 by an illumination optical system (not shown), the original pattern 2 is reduced with reduced magnification β as an image 27W and the image 27W is exposed on the shot region 48. In this manner, the reduced image of the original pattern 2 is exposed in each shot region on the wafer W and then, the wafer W is developed, process such as etching is carried out, and a circuit pattern of a certain layer of an electronic device is formed in each shot region on the wafer W. After such pattern forming steps are repeated, bonding and dicing steps and the like are carried out and the electronic devices are produced.

As a projection exposure apparatus for exposing the reticle R, a reduction projection type exposure apparatus of scanning exposure type such as step and scan type.

The electronic devices are produced in this manner, in the reticle R of this embodiment, since the non-uniformity of transmissivity distribution of the substrate 1 itself of the reticle R is compensated by the thin film 3, it is possible to excellently maintain the uniformity of the line width of the circuit pattern transferred and formed from the reticle R, operation speed of the electronic device can be enhanced.

Further, it is possible to realize a lithograph using exposure wavelength of extremely short wavelength, i.e., lithography capable of transferring extremely fine pattern. Such a lithography could not be realized conventionally because the transmissivity distribution of the substrate itself of the reticle is not uniform. Therefore, it is possible to further increase the packing density of the electronic devices and enhance the speed thereof.

Although the member for compensating the non-uniformity of the transmissivity distribution of the substrate 1 of the reticle is the thin film 3 provided on the back surface B of the pattern surface A on the substrate 1 in the above embodiment, the compensating member is not limited to the thin film 3, and it is also possible to improve the uniformity by charging absorbent substance on the surface of the substrate 1 to lower the transmissivity of that portion. The charging operation may be carried out by irradiating the substrate 1 with ion which is accelerated by high voltage, or by evaporating substance to be charged on the surface of the substrate 1 and allowing the substance to penetrate into inside by annealing (heating). In this case also, the amount of substance to be charged is of course changed in accordance with a position in the pattern surface of the substrate 1 in accordance with the transmissivity distribution of the measured substrate 1 itself.

A portion of the substrate 1 having low transmissivity, the substrate 1 itself may be polished and ground to enhance the transmissivity.

A second embodiment of the present invention will be explained with reference to FIG. 4.

Figure 4:
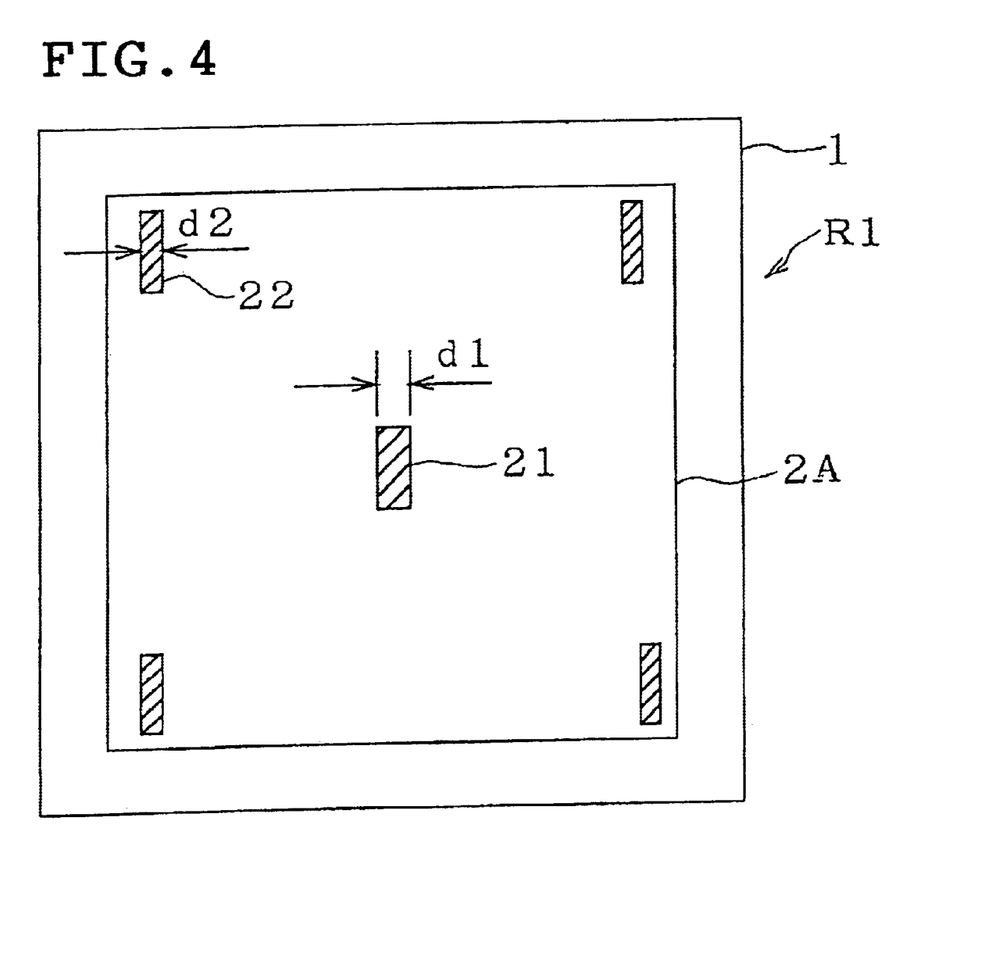
FIG. 4 is a plan view showing a reticle according to a second embodiment of the present invention.

FIG. 4 shows a reticle R1 of the second embodiment. In FIG. 4, as the substrate 1, a flat plate formed of quartz or synthetic quartz doped with a predetermined impurity is used. An original pattern 2A if formed on a pattern surface of the substrate 1 of this embodiment, a back surface of the pattern surface is not formed with a thin film or the like. In this embodiment, the original pattern 2A itself is used as a member for uniformizing the transmissivity distribution. That is, in this embodiment also, like the first embodiment shown in FIGS. 1A and 1B, the transmissivity of the substrate 1 itself is higher at its center, and becomes lower toward the periphery or outer side of the substrate 1. As shown in FIG. 4, a size (line width) itself of a light-shield pattern of the original pattern 2A to be formed is set such that a light-shield pattern existing at the center portion of the substrate 1 itself having high transmissivity has a width d1 thicker than a designed value, and a light-shield pattern 22 existing at the peripheral portion of the substrate 1 itself having low transmissivity is thinner than the designed value (d2<d1). With this feature, since the transmissivity distribution of the reticle R1 is uniformized as a whole, the line width of the circuit pattern to be transferred can be uniformized.

In the above embodiment, the transmissivity compensating member for compensating the non-uniformity of the transmissivity distribution is provided on the back surface (opposite surface from the pattern surface) of the substrate of the reticle or mixed in the substrate, but another substrate (its material may be the same as the substrate of the reticle) which is different from the substrate of the reticle formed with the transmissivity compensating member, and this member may be integrally fixed to the reticle (the member may be brought into tight contact with the reticle or a predetermined distance may be provided therebetween), or the other substrate may be in storage in the exposure apparatus in a corresponding manner to the reticle, an identification pattern (bar code or the like) formed in the reticle may be read, and another substrate corresponding to the pattern may be disposed on the reticle stage together with the reticle.

The reticle is not limited to one comprising only the light-shield layer made of chromium (Cr), and the reticle may be a phase-shift reticle of spacial frequency modulation type (Shibuya-Levenson type), edge-emphasizing type or half-tone type.

A use for the projection exposure apparatus using the reticle is not limited to the projection exposure apparatus for producing the semiconductor devices, and the projection exposure apparatus can widely be applied to a projection exposure apparatus for liquid crystal for exposing a liquid display device pattern on a square glass plate, or a projection exposure apparatus for producing a thin film magnetic head. The projection exposure apparatus can also be used for a reticle (mask) using a photolithography step using far ultraviolet rays (DUV rays) or vacuum ultraviolet rays (VUV rays) as exposure light. The magnification of the projection optical system is not limited to the reduction system, and may be equal magnification or increased magnification.

A single wavelength laser in an infrared region or visible region lased from a DFB semiconductor laser or fiber laser may be amplified with a fiber amplifier doped with erbium (Er) (or both erbium and ytterbium (Yb), and a harmonic whose wavelength is converted into ultraviolet rays using a non-linear optical crystal.

For example, if the lasing wavelength of the signal wavelength laser is in a range of 1.544 to 1.553 $\mu$m, eight times harmonic in a range of 193 to 194 nm, i.e., ultraviolet rays having substantially the same wavelength as that of the ArF excimer laser can be obtained, and if the lasing wavelength is 1.57 to 1.58 $\mu$m, ten times harmonic in a range of 157 to 158 nm, i.e., ultraviolet rays having substantially the same wavelength as that of the $F_2$ excimer laser can be obtained.

In the first embodiment, the transmissivity compensating member for compensating the non-uniformity of the transmissivity distribution is used. However, when the transmissivity distribution of the reticle, i.e., the entire surface in the region on which the original pattern is to be formed is not uniformized even the transmissivity compensating member is used, the transmissivity is measured using a measuring system shown in FIG. 2, the line width of the original pattern is partially increased or reduced with respect to the designed value so that the remaining non-uniformity of the transmissivity distribution is compensated. That is, the first and second embodiments may be combined.

When one surface of the substrate is reformed (by charging absorbent substance to the substrate surface or by polishing the substrate surface) to compensate the non-uniformity of the transmissivity distribution, the surface of the substrate to be reformed is not limited to the back surface B, and this surface may be pattern surface A or may be both the surfaces A and B. The same can be said when the thin film in the first embodiment is formed or the transmissivity compensating member is formed on another substrate other than the substrate 1. When the thin film is formed on the pattern surface, the thin film may be formed after the original pattern is formed. Further, at least two of the plurality of structure examples (formation of the thin film, formation of transmissivity compensating member on another substrate other than the substrate 1, or reforming the substrate surface), or at least one of the plurality of structure examples and the second embodiment may be combined. The same can be said when the transmissivity compensating member is formed on another substrate other than the substrate 1. That is, when the transmissivity compensating member is formed, methods for forming the thin film, charging the absorbent substance to the substrate surface and the like may be combined. When the transmissivity compensating member is formed on another substrate other than the substrate 1, the other substrate may be disposed on any of the pattern surface or the back surface of the substrate 1.

The transmissivity compensating member may be formed on the entire surface of the reticle, or on a portion of the reticle, i.e., only a region (pattern region) generally surrounded by the light-shield band and on which the original pattern is formed. In the latter case, since a window through which the exposure illumination light passes or region on which the alignment mark or the like is formed exists outside the pattern region in some cases. Therefore, it is preferable that at least these regions are formed with the transmissivity compensating member even though the region is outside the pattern region.

In the projection exposure apparatus shown in FIG. 5, the illumination distribution in the illumination region on the reticle R irradiated with the exposure light may be adjusted so that the transmissivity distribution of the substrate 1 is compensated. At that time, an optical device in the illumination optical system is preferably moved slightly to distribute the illumination so that the illumination distribution in the exposure region on the wafer which is conjugate with the illumination region with respect to the projection optical system 42. When an optical integrator (homogenizer) provided in the illumination optical system is a fly-eye lens, an element disposed at an injection surface side of the fly-eye lens is preferably moved slightly. A method for adjusting the illumination distribution to compensate the transmissivity distribution of the substrate 1 may be used singly, or may be combined with at least one of the first and second embodiments.

The forming method of the original pattern onto the substrate 1 when the reticle is produced is not limited to the method using the electronic drawing apparatus, and may be a method using an optical type projection exposure apparatus. In this case, the reticle is produced in the following manner for example. First, a parent pattern obtained by enlarging an original pattern $1/\alpha$ times is formed on design data (including image data), the parent pattern is divided by "N" to produce partial parent patterns, and using an electronic drawing apparatus (or laser beam drawing apparatus or the like), the partial parent patterns are respectively rendered on glass substrates on which photoresists formed with light-shield films are formed, and the development, etching and the like are carried out to form N-number of master reticles. The $1/\alpha$ is reciprocal of reduced magnification a of an optical projection exposure apparatus for producing reticles, and a is ¼, ⅕ or the like for example. Using the optical projection exposure apparatus for producing reticles, reduced images of the partial parent patterns of the N-number of master reticles are sequentially stitched and transferred onto the substrate 1 on which the light-shield film is formed and the photoresist is applied, development, etching and the like are carried out to form the original pattern, and reticles are produced.

When the original pattern is formed using the optical projection exposure apparatus, since each partial parent pattern is reduced a times and projected, there is merit that drawing error of each partial parent pattern by the electronic drawing apparatus is reduced $\alpha$ times substantially. Further, a plurality of reticles are produced, the patterns of the N-number of master reticles are only repeatedly transferred. Therefore, the plurality of reticles can be produced at extremely low cost and in a short time and thus, semiconductor devices can be mass-produced inexpensively.

The semiconductor device is produced through a step for designing function and performance of the device, a step for preparing a reticle based on this design and the above-described embodiment, a step for preparing a wafer from silicon material, a step for exposing the wafer (photoresist) with exposure illumination light through the reticle produced by the above-described embodiment using the exposure apparatus shown in FIG. 5, thereby transferring the pattern of the reticle onto the wafer, a step (including a dicing step, a bonding step and a packaging step) for assembling the device, an inspection step and the like.

The illumination optical system constituted by a plurality of lenses and the projection optical system are assembled into the projection exposure apparatus, these apparatuses including the reticle are optically adjusted, the reticle stage and the wafer stage comprising a large number of mechanical parts are mounted to the projection exposure apparatus, wires and tubes are connected, and all of them are totally adjusted (electricity adjustment, confirmation of operation and the like), thereby producing the projection exposure apparatus of this embodiment. It is preferable to produce the projection exposure apparatus in a clean room where a temperature and a clean degree are managed.

The present invention is not limited to the above-mentioned embodiments, and the invention may, as a matter of course, be embodied in various forms without departing from the gist of the present invention. Furthermore, the entire disclosure of Japanese Patent Application No.10-277274 filed on Sep. 30, 1998 including description, claims, drawings and abstract are incorporated herein by reference in its entirety.

INDUSTRIAL APPLICABLILITY

According to the substrate for the photomask, or the first or second photomask of the present invention, since the transmissivity compensating member is provided, even if the transmissivity distribution of the substrate itself is not uniform, the uniformity of the transmissivity distribution is enhanced when it is irradiated with the exposure illumination light. At that time, according to the first photomask, there is merit that the thin film as the transmissivity compensating member and the original pattern can easily be formed without mechanical interference.

According to the third photomask of the invention, the line width of the original pattern is only controlled, and even if the transmissivity distribution of the substrate itself is not uniform, high uniformity of the transmissivity distribution can be obtained when it is irradiated with the exposure illumination light.

In these cases, when the substrate is formed of quartz, quartz glass or quartz glass doped with a predetermined impurity, the substrate has relatively high transmissivity even with respect to light having short wavelength of about 200 nm for example, and high uniformity of transmissivity distribution can be obtained.

According to the first, second or third exposure method, the uniformity of the line width of the pattern to be formed on the pattern surface substance.

According to the first, second or third or fourth producing method of a device, since the photomask of the present invention or the exposure method of the invention is used, high uniformity of the illumination distribution can be obtained on the substrate to be exposed. Therefore, there is merit that the uniformity of the line width of the circuit pattern to be formed is enhanced, and advanced devices can be produced.

In the lithography using, as exposure wavelength, extremely short wavelength which limits the kinds of optical material having excellent transparent, if the photomask of the invention is used, the non-uniformity of the transmissivity distribution of the substrate itself of the photomask is compensated, and the transmissivity distribution can be uniformized over the entire photomask. Therefore, as compared with the prior art, light of shorter wavelength can be used, an electronic device can be formed more finely, the packing density thereof can be increased, and the operational speed can be enhanced.

What is claimed is:

1. A substrate for a photomask, on which an original pattern is formed, comprising:
   a substrate formed of a material having non-uniformity of a transmissivity distribution; and a transmissivity compensating member which is formed on the substrate and which compensates for the non-uniformity of the transmissivity distribution of the substrate.

2. A substrate for a photomask as recited in claim 1, wherein a member selected from the group consisting of quartz, quartz glass, quartz glass doped with a predetermined impurity, sapphire and magnesium fluoride is used as the material of the substrate.

3. A substrate for a photomask as recited in claim 1, wherein the transmissivity compensating member comprises a thin film provided on one surface of the substrate, and a film thickness distribution of the thin film is set in accordance with the transmissivity distribution of the substrate.

4. A substrate for a photomask as recited in claim 3, wherein the thin film is made of a member selected from the group consisting of silicon dioxide, aluminum oxide, magnesium fluoride, aluminum fluoride and a metal thin film.

5. A substrate for a photomask as recited in claim 1, wherein the transmissivity compensating member is formed by reforming a portion of at least one surface of the substrate.

6. A substrate for a photomask as recited in claim 1, wherein the transmissivity compensating member is formed by providing another substrate other than the substrate with a transmissivity distribution which substantially compensates for the non-uniformity of the transmissivity distribution of the substrate.

7. A photomask comprising:

a substrate formed of a material having non-uniformity of a transmissivity distribution;

a transmissivity compensating member which is formed on one surface of the substrate and which compensates for the non-uniformity of the transmissivity distribution of the substrate; and an original pattern formed on a surface of the substrate opposite to the one surface of the substrate.

8. A photomask comprising:

a substrate formed of a material having non-uniformity of a transmissivity distribution;

a transmissivity compensating member which is formed on one surface of the substrate and which compensates for the non-uniformity of the transmissivity distribution of the substrate; and an original pattern formed on a surface of the substrate opposite to the one surface of the substrate, and having a line width which is made to be different from a designed value in accordance with the transmissivity distribution of the substrate provided with the transmissivity compensating member.

9. A photomask comprising:

a substrate formed of a material having non-uniformity of a transmissivity distribution; and an original pattern formed on a surface of the substrate, and having, in order to compensate for the non-uniformity of the transmissivity distribution of the substrate, a line width which is made to be different from a designed value in accordance with the transmissivity distribution of the substrate.

10. A photomask as recited in claim 9, wherein a member selected from a group consisting of quartz, quartz glass, quartz glass doped with a predetermined impurity, sapphire and magnesium fluoride is used as the material of the substrate.

11. An exposure method, comprising:

illuminating a photomask including a substrate formed of a material having non-uniformity of a transmissivity distribution a transmissivity compensating member which is formed on one surface of the substrate and which compensates for the non-uniformity of the transmissivity distribution of the substrate, and an original pattern formed on a surface of the substrate opposite to the one surface of the substrate; and exposing a photosensitive object with light which has passed through the original pattern of the photomask.

12. An exposure method as recited in claim 11, wherein a line width of at least a portion of the original pattern is made different from a designed value in accordance with the transmissivity distribution of the photomask provided with the transmissivity compensating member.

13. An exposure method as recited in claim 11, further comprising adjusting an illumination distribution of the light on the photosensitive object in accordance with the transmissivity distribution of the photomask provided with the transmissivity compensating member.

14. An exposure method, comprising:

illuminating a photomask including a substrate formed of a material having non-uniformity of a transmissivity distribution and an original pattern formed on a surface of the substrate;

exposing a photosensitive object with light which has passed through the original pattern of the photomask; and a adjusting an illumination distribution of the light on the photosensitive object in accordance with the transmissivity distribution to compensate for the non-uniformity of the transmissivity distribution of the photomask, when the photomask is illuminated.

15. An exposure method, comprising:

illuminating a photomask including a substrate formed of a material having non-uniformity of a transmissivity distribution and an original pattern formed on a surface of the substrate and having a line width which is, to compensate for the non-uniformity of the transmissivity distribution of the substrate, made to be different from a designed value in accordance with the transmissivity distribution of the substrate; and exposing a photosensitive object with light which has passed through the original pattern of the photomask.

16. A device producing method comprising exposing the original pattern on the substrate onto a substrate for a device by illuminating the photomask as recited in claim 7 with illumination light which has passed through the substrate.

17. A device producing method comprising exposing the original pattern on the substrate onto a substrate for a device by illuminating the photomask as recited in claim 9 with illumination light which has passed through the substrate.

18. A device producing method comprising exposing the original pattern on the substrate onto a substrate for a device by illuminating the photomask as recited in claim 9 with illumination light which has passed through the substrate.

19. A device producing method, comprising transferring a device pattern onto a substrate for a device using the exposure method as recited in claim 11.

* * * * *